United States Patent [19]

Nativ

[11] Patent Number: 5,422,613

[45] Date of Patent: Jun. 6, 1995

[54] VARACTOR DIODE FREQUENCY MULTIPLIER

[75] Inventor: Zvi Nativ, Haifa, Israel

[73] Assignee: State of Israel, Ministry of Defense Armament Development Authority, Rafael, Haifa, Israel

[21] Appl. No.: 91,666

[22] Filed: Jul. 14, 1993

[30] Foreign Application Priority Data

Jul. 15, 1992 [IL] Israel .................................... 102513

[51] Int. Cl.$^6$ ................................................ H01P 1/20
[52] U.S. Cl. ...................................... 333/218; 363/158
[58] Field of Search ............................ 333/218; 363/158

[56] References Cited

U.S. PATENT DOCUMENTS

| | | | |
|---|---|---|---|
| 3,263,154 | 7/1966 | Steele | 363/158 |
| 3,334,295 | 8/1967 | Polin et al. | 333/218 |
| 3,534,244 | 10/1970 | Brounley | 333/218 |
| 3,818,388 | 6/1974 | Hill et al. | 333/218 X |
| 4,595,892 | 6/1986 | Martinetti et al. | 333/218 |
| 4,749,949 | 4/1986 | Albin et al. | |

FOREIGN PATENT DOCUMENTS 2179268  8/1973  France .

OTHER PUBLICATIONS

B. N. Lyons and T. E. Ciardha "Development of a 750 GHz Solid State Source", Conference Proceedings, 21st European Microwave Conference, Microwave '91 pp. 237–242.

B. C. Henderson and A. W. Denning, "Single-Balanced Mixer Forms Dual MM-Wave Frequency Multiplier", Microwaves and RF, vol. 29 No. 10, pp. 81–82 and 84–86.

A. I. Grayzel and W. Emswiler, "Frequency Multiplication by a Prime Number Using Multiplier Chains", 1978 IEEE MTT-S International Microwave Symposium Digest, pp. 321–322.

R. M. Henry, "Stacked Varactors with Four Snap-Off Diodes in Series for Very High Power Multipliers", 1973 European Microwave Conference, vol. I, pp. A4–5/4.

H. E. Elder, "Active Solid-State Devices", Bell System Technical Journal, vol. 47, No. 7, pp. 1323–1377.

A. Raisanen et al, "Capability of Schottky-Diode Multipliers as Local Oscillators at 1 THz", Microwave and Optical Technology Letters, vol. 4, No. 1, pp. 29–33.

J. F. Cushman et al, "High Power Expitaxially Stacked Varactor Diode Multipliers: Performance and Application at W-band", 1990, IEEE MTT-S Inter. Symposium Digest. pp. 923–926, vol. 2.

J. W. Archer et al, "High-Output, Single and Duel Diode, Millimeter Wave Frequency Doublers", IEEE Trans. on Microwave Theory and Technology, vol. MTT-33, No. 6, pp. 533–538.

L. Afzelius et al, "integrated Stripline Multiplier Chain", Proceedings of the 1971 European Microwave Confrence Part II, p. C10/5.

P. W. Staecker et al, "10 to 40 GHZ Doubler-Doubler Chain for Satcom Application", Microwave Journal. vol. 28, No. 12, Dec. 1985, pp. 87–108.

*Primary Examiner*—Paul Gensler
*Attorney, Agent, or Firm*—Helfgott & Karas

[57] ABSTRACT

An integrated varactor diode frequency multiplier assembly including a first varactor diode frequency multiplier circuit having a non-stepped waveguide output, a second varactor diode frequency multiplier circuit having a non-stepped waveguide input and a non-stepped waveguide for integrally connecting the output of the first circuit to the input of the second circuit, wherein the impedance level of the input of the second circuit is similar to the impedance level of the output of the first circuit.

9 Claims, 4 Drawing Sheets

VARACTOR DIODE FREQUENCY MULTIPLIER

FIELD OF THE INVENTION

The present invention relates to varactor diode frequency multipliers.

BACKGROUND OF THE INVENTION

Varactor diode frequency multipliers are well known in the art. Typical varactor diode frequency multipliers are either triplers or doublers. It is known to connect such frequency multipliers in cascaded chains so as to provide a selected multiplication factor. Usually an isolator is provided between the individual frequency multipliers so as to prevent interference therebetween.

A typical frequency multiplier chain is described in an article entitled "10 to 40 GHz Doubler-Doubler Chain for Satcom Applications", by P. W. Staecker and R. W. Chick, published in Microwave Journal, December 1985, pp. 87-108.

MMW (millimeter wave) varactor diode frequency multipliers are employed in various MMW communications systems, such as transceivers, RF heads, and the like. In many applications there is used a cascaded frequency multiplier chain, similar to that described in the above-referenced article.

As is well known to persons skilled in the art, as varactor diode frequency multipliers are manufactured for use as individual frequency multipliers of a cascaded chain, each such multiplier is manufactured with both input and output matching networks. For frequency multipliers manufactured for use in MMW and high microwave range applications matching networks are typically in the form of stepped waveguides.

In a cascaded frequency multiplier chain of two or more frequency multipliers, the output frequency of the first multiplier is the same as the input frequency of the second multiplier. Accordingly, the output matching network of the first multiplier and the input matching network of the second multiplier are provided in the form of similar stepped waveguides.

Accordingly, among disadvantages of cascaded chain arrangements of conventional varactor diode frequency multipliers is that they are very expensive to manufacture, due mainly to the provision of a large number of highly accurate machined parts, including stepped waveguides. Furthermore, the efficiency of such cascaded chains is reduced due to the provision of isolators between their constituent frequency multipliers and due to the matching networks therebetween. It would also be desirable to reduce the weight and size of varactor diode frequency multiplier chains to a minimum.

Frequency multiplier chains are described in the following articles:

"Development of a 750 GHz Solid State Source", published in Conference Proceedings, 21st European Microwave Conference, Microwave '91 pp. 237-42 by B. N. Lyons, T. E. O'Ciardha, U. S. Lidholm, and B. L. A. Rydberg;

"Single-Balanced Mixer Forms Dual MM-Wave Frequency Multiplier", published in Microwaves and RF, vol. 29, no. 10, pp. 81-82 and 84-86 by B. C. Henderson and A. W. Denning;

"Frequency Multiplication by a Prime Number Using Multiplier Chains" published in 1978 IEEE MTT-S International Microwave Symposium Digest, pp. 321-322 by A. I. Grayzel and W. Emswiler;

"Stacked Varactors with Four Snap-Off Diodes in Series for Very High Power Multipliers", published in 1973 European Microwave Conference, Vol. I, pp. A4-5/4 by R. M. Henry;

"Active Solid-State Devices", published in Bell System Technical Journal, Vol. 47, no. 7, pp. 1323-1377 by H. E. Elder;

"Capability of Schottky-Diode Multipliers as Local Oscillators at 1 THz", published in Microwave and Optical Technology Letters, Vol. 4, no. 1, pp. 29-33 by A. Raisanen and M. Sironen;

"High Power Epitaxially Stacked Varactor Diode Multipliers: Performance and Applications at W-band", published in 1990 IEEE MTT-S International Symposium Digest (Cat. No. 90CH2828-0), pp. 923-926, Vol. 2 by J. F. Cushman, F. Occhiuti, E. M. McDonagh, M. E. Hines and P. W. Staecker;

"High-output, Single- and Dual-diode, Millimeterwave Frequency Doublers", published in IEEE Transactions on Microwave Theory and Techniques, Vol. MTT-33, no. 6, pp. 533-538 by J. W. Archer and M. T. Faber; and "Integrated Stripline Multiplier Chain", published in the Proceedings of the 1971 European Microwave Conference Part II, p. C10/5 by L. Afzelius, B. Hagaeus and G. Hanson.

SUMMARY OF THE INVENTION

The present invention seeks to provide an integrated varactor diode frequency multiplier assembly that is less expensive to manufacture, more efficient, and both smaller and lighter than cascaded varactor diode frequency multiplier chains of conventional manufacture.

There is provided, therefore, in accordance with a preferred embodiment of the present invention, an integrated varactor diode frequency multiplier assembly which includes:

- a first varactor diode frequency multiplier circuit having a non-stepped waveguide output;
- a second varactor diode frequency multiplier circuit having a non-stepped waveguide input; and
- non-stepped waveguide means for integrally connecting the output of the first circuit to the input of the second circuit,
- wherein the impedance of the input of the second circuit is similar to the impedance level of the output of the first circuit.

Preferably, in the integrated assembly the first circuit includes a first varactor diode selected for frequency multiplication by a first multiplication factor and the second circuit includes a second varactor diode selected for frequency multiplication by a second factor.

In a preferred embodiment of the invention, the input of the second circuit includes a coaxial network, and the non-stepped waveguide means is arranged to transfer signals from the output of the first varactor diode to the coaxial network, which is connected to the second varactor diode.

Preferably, the assembly also includes apparatus for enabling testing of the first circuit separately from the second circuit, preferably including a waveguide apparatus.

In a preferred embodiment of the invention the first circuit includes a coaxial input matching network. Preferably, the second circuit includes a stepped waveguide output matching network.

Preferably, the non-stepped waveguide means is a reduced height waveguide.

Preferably, the first circuit is a tripler and the second circuit is a doubler.

In a preferred embodiment of the invention, the wherein said integrated assembly is a millimeter wave varactor diode frequency multiplier assembly, preferably a Ku band to W band tripler-doubler varactor diode frequency multiplier assembly.

BRIEF DESCRIPTION OF THE DRAWINGS

The present invention will be more fully understood and appreciated from the following detailed description taken in conjunction with the drawings, in which.

DETAILED DESCRIPTION OF A PREFERRED EMBODIMENT

Figure 1:
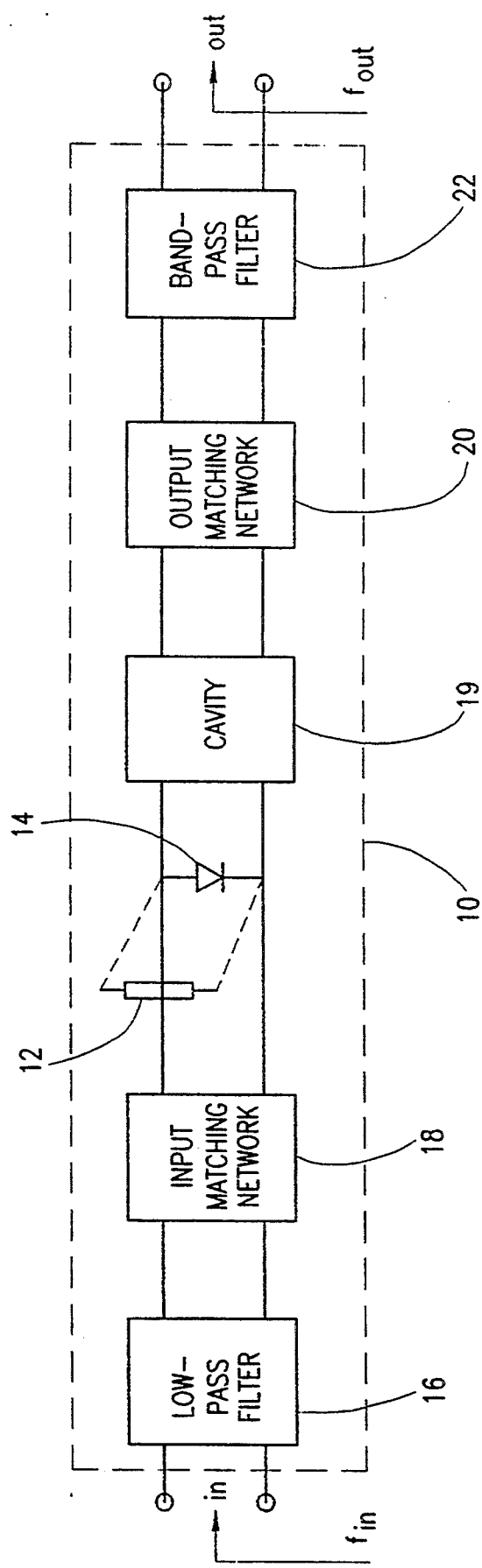
FIG. 1 is a general block diagram of a varactor diode frequency multiplier.

Referring now to FIG. 1, there is illustrated in block diagram form a single varactor diode frequency multiplier, referenced generally at 10, of conventional construction. The frequency multiplier comprises an idler 12 and a varactor diode 14 which receive an input signal at a frequency $f_{in}$ via a low pass filter 16 and an input matching network 18. Input matching network 18 is either of the coaxial or the stepped waveguide variety, depending on the frequency range of the intended application of the frequency multiplier.

An output signal is provided by the varactor diode via a cavity 19, an output waveguide matching network 20 and a band pass filter 22. The output signal is at a frequency $f_{out}$ which is a predetermined multiple n of $f_{in}$. Typically n is either 2 or 3, although it may be any preselected multiplier.

Figure 2:
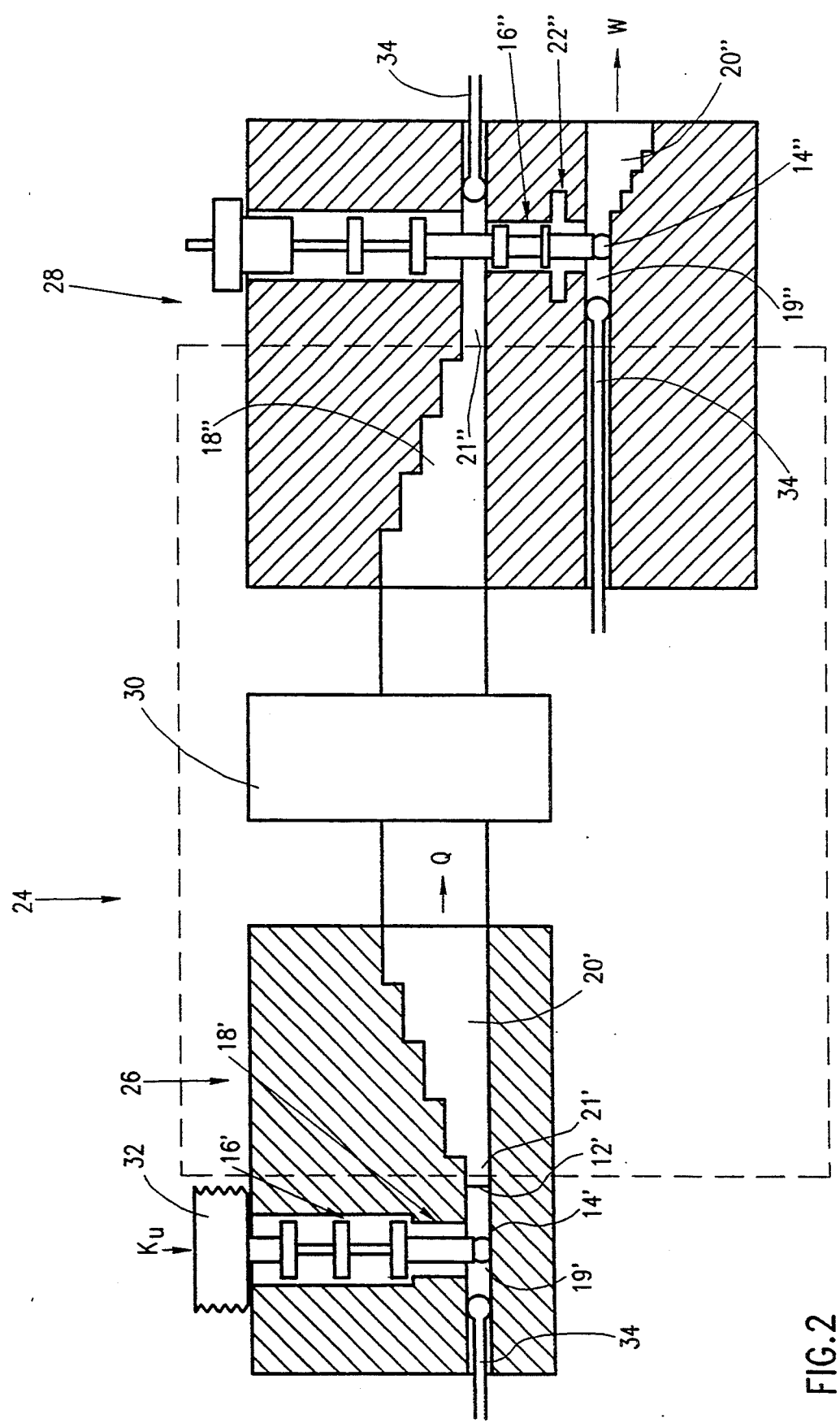
FIG. 2 is a schematic cross-sectional illustration of a prior art cascaded chain arrangement of varactor diode frequency multipliers.

Referring now to FIG. 2, there is illustrated a typical prior art cascaded chain of varactor diode frequency multipliers. The illustrated cascaded chain is referenced generally 24. Chain 24 may, in general, be either a MMW or a high microwave range frequency multiplier chain. In the present example, however, chain 24 is a MMW Ku to W (approximately 15-90 GHz) tripler-doubler multiplier chain. Chain 24 thus has a Ku to Q (approximately 45 GHz) tripler in series with a Q to w doubler. The respective tripler and doubler circuits are referenced generally as 26 and 28. Tripler 26 and doubler 28 are separated by an isolator 30.

Both tripler 26 and doubler 28 are constructed in a generally similar manner to the frequency multiplier illustrated and described above in conjunction with FIG. 1. Accordingly, components of frequency multiplier 10 of FIG. 1 that are present in tripler 26 are denoted by similar reference numerals, but with a prime notation (') added. Similarly, components of frequency multiplier 10 of FIG. 1 that are present in doubler 28 are denoted by similar reference numerals, but with a double prime (") notation added.

As will be appreciated by persons skilled in the art, however, the precise configuration of any given multiplier will depend on whether it is a tripler or a doubler, and on its intended position in the chain.

In the present example, tripler 26 is connected via a coaxial connector 32 to a signal source (not shown) to receive an input signal in frequency band Ku. Tripler 26 provides an output signal via stepped waveguide output matching network 20' in frequency band Q. The output signal is provided, via isolator 30, to stepped waveguide input matching network 18" of doubler 28. Output waveguide 20' of tripler 26 and input waveguide 18" of doubler 28 are configured to have similar impedance levels. Isolator 30 is provided to prevent reflection of energy from doubler 28 to tripler 26. Both cavities 19' and 19" preferably have adjustable shorts 34 for enabling trimming of their respective associated circuits.

Figure 3:
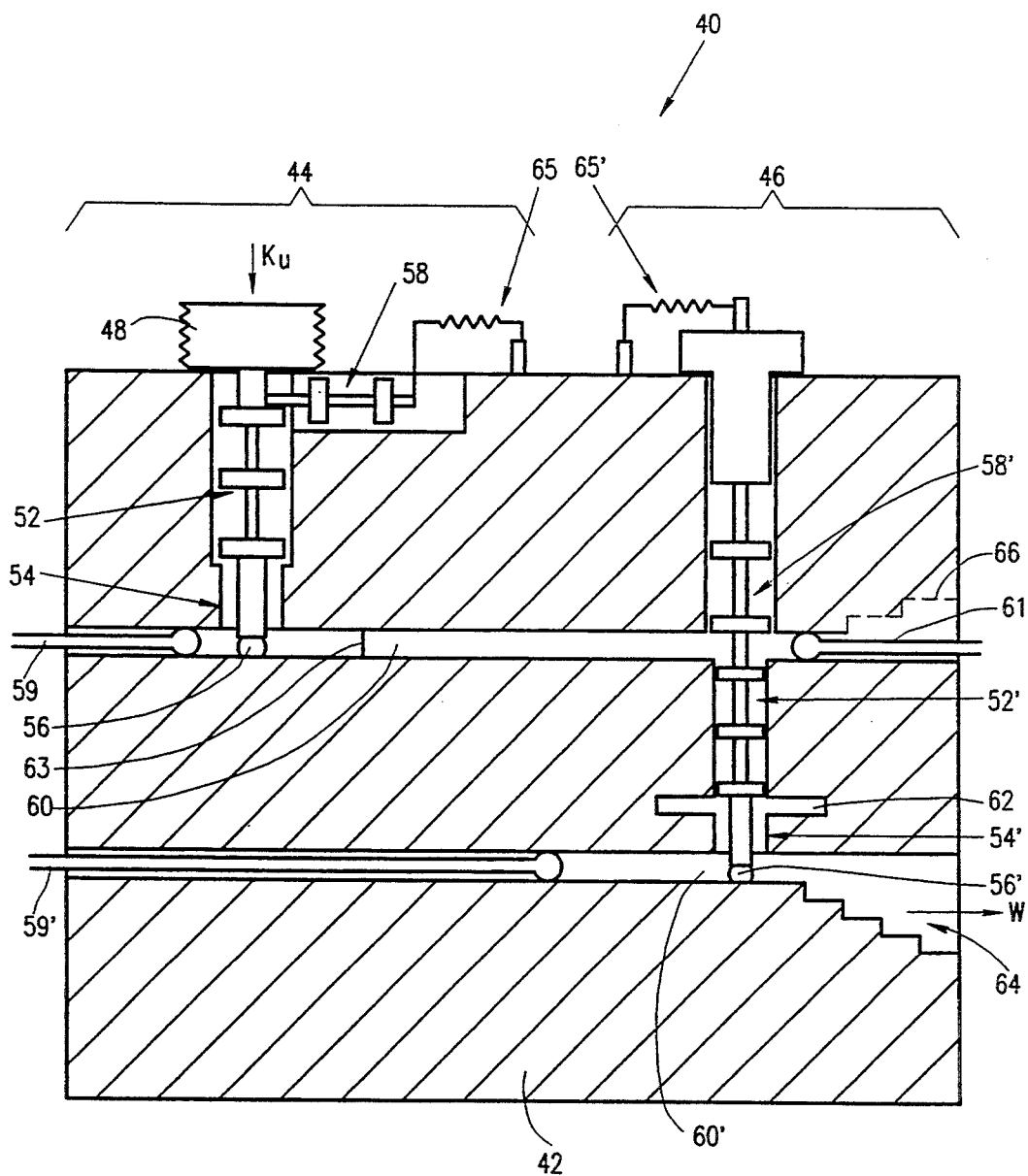
FIG. 3 is a schematic cross-sectional illustration of an integrated varactor diode frequency multiplier assembly suitable for use in MMW and high microwave range applications, constructed in accordance with a preferred embodiment of the present invention.

Reference is now made to FIG. 3, in which is illustrated in cross-section an integrated varactor diode frequency multiplier assembly, referenced generally 40, constructed in accordance with a preferred embodiment of the present invention. Although, in the present example, assembly 40 is described as a Ku to W tripler-doubler frequency multiplier, assembly 40 is also suitable for use in the upper range of microwave frequencies, sometimes referred to herein as "high microwave," as well as for other ranges of mm waves. The assembly is also suitable for near sub-millimeter frequencies.

The integrated frequency multiplier assembly 40 of the invention comprises a housing 42, a first varactor diode frequency multiplier circuit 44 and a second varactor diode frequency multiplier circuit 46. Circuits 44 and 46 are integrally connected by use of waveguide technology, as will be appreciated from the ensuing description.

In the present example, wherein assembly 40 is a MMW frequency multiplier assembly, first circuit 44 receives an input signal at a frequency in the Ku band from an external signal source (not shown) via a coaxial connector 48. The signal is passed via a first coaxial low pass filter 52 and a first coaxial input matching network 54 to a first varactor diode 56 arranged in electrically conductive association with a nonstepped waveguide in the form of a first cavity 60. The varactor diode generates signals at harmonic frequencies of the input signal frequency. An idler 63 is arranged in first cavity 60. Idler 63 acts as a short circuit for the second harmonic which may be generated by circuit 44 but is transparent to the desired third harmonic. Effectively, first cavity 60 defines an integral connection between the output network of first circuit 44 and the input network of second circuit 46.

In the present example, first cavity 60 is a reduced height waveguide.

First varactor diode 56 generates a DC current which, after passing through a further low pass filter 58 and a resistor 65, causes self-biasing of the varactor diode 56 by a DC voltage thereacross. The input signal to first circuit 44 provided via coaxial connector 48 does not see the low pass filter 58, the function of which is to pass DC signals only. A first sliding short 59 is provided in first cavity 60 for trimming first circuit 44.

A signal provided as output from first varactor diode 56 is transferred via first cavity 60 so as to be provided as input to second circuit 46 via a second coaxial low pass filter 52', a band stop filter 62, and coaxial matching network 54'. The signal is applied to second varactor diode 56', arranged in an electrically conductive reduced height non-stepped waveguide mounting in the form of a second cavity 60'.

Band stop filter 62 is illustrated as being of the radial line type and is used to prevent feedback of the W-band frequency output signal. A second short 59' is provided in second cavity 60' for trimming second circuit 46.

Second varactor diode 56' generates a DC current which, after passing through a further low pass filter 58' and a resistor 65', causes self-biasing of the varactor diode 56' by a DC voltage thereacross. An output signal is provided at a frequency in the W band via a stepped waveguide output matching network 64.

Referring again to FIG. 2, which illustrates a varactor diode frequency multiplier cascaded chain 24 of the prior art, stepped waveguide 20' of tripler 26 is required to match the low impedance level of reduced height waveguide 21' to a high level load impedance similar to the input impedance of doubler 28. In the present example, wherein the tripler 26 is connected in series with doubler 28, input stepped waveguide 18" is required to match the high level input impedance of doubler 28 to the characteristic low impedance level of reduced height waveguide 21" of doubler circuit 28.

In the integrated assembly 40 of the present invention, however, the first and second circuits 44 and 46 are manufactured as a single, integrated unit functioning as a six-times frequency multiplier. The connection therebetween of a non-stepped waveguide in the form of cavity 60 provides for similar characteristic impedance levels at the output of first circuit 44 and at the input of second circuit 46. Accordingly, first circuit 44 does not require a stepped waveguide output matching network and second circuit 46 does not require a stepped waveguide input matching network. Similarly, as opposed to the prior art cascaded chain arrangement, no isolator is required.

Fewer machined parts of tight tolerances and, in particular, fewer stepped waveguides are required in the integrated assembly 40 of the present invention. Accordingly, assembly 40 is significantly cheaper to manufacture than a prior art cascaded chain arrangement performing a similar function.

Furthermore, as assembly 40 of the invention is a single, integrated assembly, and does not therefore use either an isolator or an output-input pair of stepped waveguide matching networks, the electrical efficiency of assembly 40 is higher than that of an equivalent prior art cascaded chain. Integrated assembly 40 may be made smaller and thus also lighter than the equivalent prior art cascaded chain.

A further feature of the integrated assembly 40 of the present invention is the optional provision therein of a Q-band stepped waveguide output matching network 66. Provision of this additional waveguide enables output of the Q-band to be tested. This would typically be required during development and assembly of integrated assembly 40. After testing of the Q-band tripler circuit 44 matching network 66 has no further use. Accordingly, an additional short 61 extending into the continuation of first cavity 60 is provided.

Figure 4:
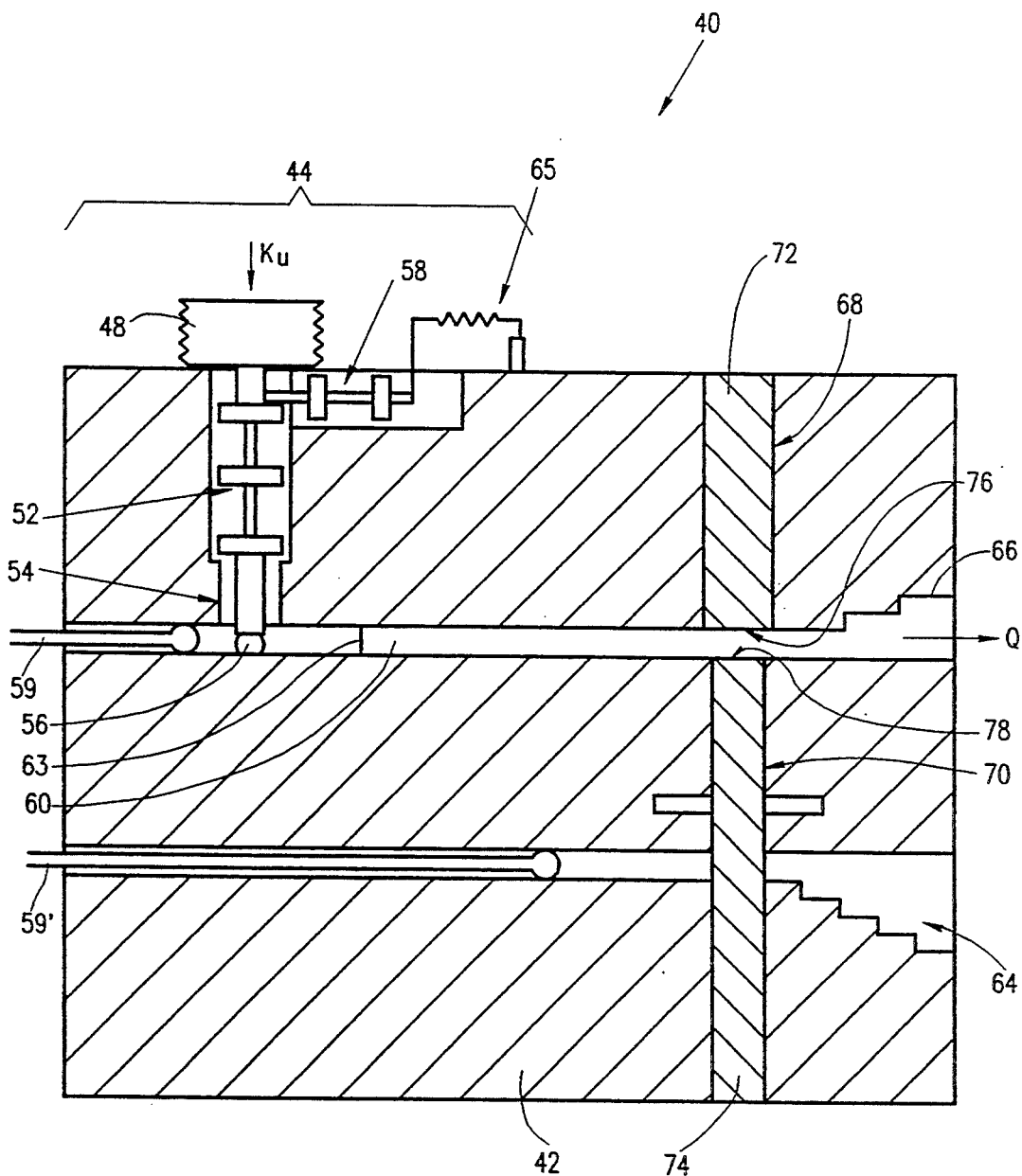
FIG. 4 is a schematic cross-sectional illustration of the integrated varactor diode frequency multiplier assembly of FIG. 3, but wherein the integrated assembly has been adapted for testing a single circuit thereof.

Referring now to FIG. 4, testing of the Q-band output via stepped waveguide 66 requires removal of all the removable components of second circuit 46 from upper and lower cylindrical bores 68 and 70 which extend transversely to cavities 60 and 60'. Short 61 is also removed. Upper and lower bores 68 and 70 are then blocked, for example, by suitably configured upper and lower plugs, respectively referenced 72 and 74. The facing ends 76 and 78 of the respective upper and lower screws are spaced apart so as to define therebetween a continuation of first cavity 60. Testing of the Q-band output may then be performed in a conventional manner.

In a comparison of integrated assembly 40 of the present invention with an equivalent prior art cascaded chain arrangement of the prior art, it was found that:

A. integrated assembly 40 is about 25% cheaper to manufacture than an equivalent prior art chain arrangement due to the absence of an isolator, and also due to reduced machining costs stemming from the provision of fewer tight tolerance machined parts;

B. integrated assembly 40 is 30–50% smaller and lighter than an equivalent prior art chain arrangement; and C. the efficiency and power output of integrated assembly 40 are 10–20% higher than those of an equivalent prior art chain arrangement due to the absence both of isolator loss and also of matching network losses at the output of first circuit 44 and at the input of second circuit 46.

It will be appreciated by persons skilled in the art that the scope of the present invention is not limited by what has been shown and described hereinabove by way of example. The scope of the present invention is defined rather, solely by the claims which follow.

I claim:

1. An integrated varactor diode frequency multiplier assembly comprising:

a first varactor diode frequency multiplier circuit;

a second varactor diode frequency multiplier circuit; and a uniform cross-section waveguide operative to integrally connect the first circuit to the second circuit, wherein the impedance of the input of the second circuit is similar to the impedance level of the output of the first circuit, and wherein the second circuit comprises a coaxial matching network, and the uniform cross-section waveguide is arranged to transfer signals from a first varactor diode in the first circuit to the coaxial matching network.

2. Apparatus according to claim 1, and wherein the first circuit is a tripler.

3. An integrated assembly according to claim 1 and wherein said second circuit is a doubler.

4. An integrated assembly according to claim 1, and wherein said integrated assembly is a millimeter wave varactor diode frequency multiplier assembly.

5. An integrated assembly according to claim 1, and wherein said assembly is an integrated Ku band to W band tripler-doubler varactor diode frequency multiplier assembly.

6. An integrated varactor diode frequency multiplier assembly comprising:

a first varactor diode frequency multiplier circuit;

a second varactor diode frequency multiplier circuit;

a uniform cross-section waveguide operative to integrally connect the first circuit to the second circuit; and a first circuit tester operative to test the first circuit separately from the second circuit, wherein the impedance of the input of the second circuit is similar to the impedance level of the output of the first circuit.

7. An integrated varactor diode frequency multiplier assembly comprising:
   a first varactor diode frequency multiplier circuit;
   a second varactor diode frequency multiplier circuit; and
   a uniform cross-section waveguide operative to integrally connect the first circuit to the second circuit,
   wherein the impedance of the input of the second circuit is similar to the impedance level of the output of the first circuit, and
   wherein the first circuit comprises a coaxial input matching network.

8. An integrated varactor diode frequency multiplier assembly comprising:
   a first varactor diode frequency multiplier circuit;
   a second varactor diode frequency multiplier circuit; and
   a uniform cross-section waveguide operative to integrally connect the first circuit to the second circuit,
   wherein the impedance of the input of the second circuit is similar to the impedance level of the output of the first circuit, and
   wherein the second circuit comprises a stepped waveguide output matching network.

9. An integrated varactor diode frequency multiplier assembly comprising:
   a first varactor diode frequency multiplier circuit;
   a second varactor diode frequency multiplier circuit; and
   a uniform cross-section waveguide operative to integrally connect the first circuit to the second circuit,
   wherein the impedance of the input of the second circuit is similar to the impedance level of the output of the first circuit, and
   wherein the uniform cross-section waveguide comprises a reduced height waveguide.

* * * * *